US009336856B2

(12) United States Patent  (10) Patent No.: US 9,336,856 B2
Kinoshita et al.  (45) Date of Patent: May 10, 2016

(54) DEVICE AND APPARATUS HAVING ADDRESS AND COMMAND INPUT PATHS

(71) Applicant: Micron Technology, Inc., Boise, ID (US)

(72) Inventors: Hiroto Kinoshita, Tokyo (JP); Hiroki Fujisawa, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/638,836

(22) Filed: Mar. 4, 2015

(65) Prior Publication Data

US 2015/0255145 A1  Sep. 10, 2015

(30) Foreign Application Priority Data

Mar. 6, 2014  (JP) ................. 2014-044045

(51) Int. Cl.
  *G11C 8/00*  (2006.01)
  *G11C 11/408*  (2006.01)
  *G11C 11/4093*  (2006.01)
  *G11C 7/10*  (2006.01)

(52) U.S. Cl.
  CPC .......... *G11C 11/4082* (2013.01); *G11C 7/1087* (2013.01); *G11C 11/4093* (2013.01); *G11C 7/10* (2013.01); *G11C 7/1093* (2013.01); *G11C 2207/105* (2013.01)

(58) Field of Classification Search
  CPC ...... G11C 7/1087; G11C 7/1093; G11C 7/10; G11C 11/4082; G11C 11/4093; G11C 2207/105

USPC ............ 365/230.08, 63, 189.05, 189.18, 191, 365/198
  See application file for complete search history.

(56) References Cited

U.S. PATENT DOCUMENTS

| 7,167,401 | B2 * | 1/2007 | Stave ................. | G11C 7/1078 365/189.05 |
| 8,174,910 | B2 * | 5/2012 | Sato .................. | G11C 5/147 326/80 |
| 8,300,482 | B2 * | 10/2012 | Bae ................... | G11C 7/1051 365/189.05 |
| 8,422,263 | B2 * | 4/2013 | Saito ................ | G11C 5/04 365/189.03 |
| 2001/0004335 | A1 * | 6/2001 | Murakami ............ | G11C 7/1066 365/233.1 |
| 2015/0255145 | A1 * | 9/2015 | Kinoshita .......... | G11C 11/4082 365/230.08 |

FOREIGN PATENT DOCUMENTS

JP  2002-237188  8/2002

* cited by examiner

*Primary Examiner* — Tan T. Nguyen
(74) *Attorney, Agent, or Firm* — Dorsey & Whitney LLP (57) ABSTRACT

A device includes a plurality of input terminals, a control circuit, and a plurality of signal buses. Each of the signal buses is coupled between the control circuit and an associated one of the plurality of input terminals and includes one or more first buffers, one or more second buffers and at least one latch circuit coupled between the one or more first buffers and the one or more second buffers. The one or more first buffers of one of the signal buses are different in number from the one or more first buffers of a different one of the signal buses.

21 Claims, 11 Drawing Sheets

Fig. 11 and is mounted on an external substrate 2. The external substrate 2 is a memory module substrate or a mother board, and
DEVICE AND APPARATUS HAVING ADDRESS AND COMMAND INPUT PATHS This application is based upon and claims the benefit of priority from Japanese patent application No. 2014-044045 filed on Mar. 6, 2014, the disclosure of which are incorporated herein in its entirely by reference.

BACKGROUND

1. Field of the Invention

This invention relates to a semiconductor device and a system including the semiconductor device, in particular, a semiconductor device that latches a plurality of control signals in synchronization with a clock signal.

2. Description of the Related Art

An Address signal including multiple bits, etc., is input to a semiconductor device, such as DRAM (Dynamic Random Access Memory), and is latched in synchronization with a clock signal inside the semiconductor device. Latch circuits that latch respective bits of the address signal are usually arranged together in one place, as described in patent document 1.

[Patent Document 1] Japanese Laid-Open Patent Publication No. 2002-237188

However, according to a layout of the semiconductor device described in patent document 1, the distance between an input terminal and a latch circuit is different for each of the bits. This results in a smaller latch margin, thus making the use of a high-speed clock signal difficult. Solving such a problem requires a specific layout such that some interconnects are detoured so that the distance between the input terminal and the latch circuit become equal for every bit. However, such a layout poses a problem that a chip area is increased and that current consumption grows larger because of charge/discharge through a parasitic capacitance created by detoured interconnects.

SUMMARY

In one embodiment, there is provided a device that includes a plurality of input terminals, a control circuit, and a plurality of signal buses. Each of the signal buses is coupled between the control circuit and an associated one of the plurality of input terminals and includes one or more first buffers, one or more second buffers and at least one latch circuit coupled between the one or more first buffers and the one or more second buffers. The one or more first buffers of one of the signal buses are different in number from the one or more first buffers of a different one of the signal buses.

In another embodiment, there is provided a device that includes first and second input terminals, a control circuit, first and second latch circuits provided correspondingly to the first and second input terminals, one or more first buffers coupled between the first input terminal and the first latch circuit, one or more second buffers coupled between the first latch circuit and the control circuit, one or more third buffers coupled between the second input terminal and the second latch circuit, and one or more fourth buffers coupled between the second latch circuit and the control circuit. The one or more first buffers are larger in number than the one or more third buffers and the one or more second buffers are smaller in number than the one or more fourth buffers.

In still another embodiment, there is provided a system that includes a controller including first and second external terminals, and a memory device including third and fourth external terminals coupled respectively to the first and second external terminals, first and second latch circuits, one or more first buffers coupled between the third external terminal and the first latch circuit, and one or more second buffers coupled between the fourth external terminal and the second latch circuit. The one or more first buffers are different in number from the one or more second buffers.

DETAILED DESCRIPTION OF THE EMBODIMENTS

In embodiments of the invention, each input signal is latched in different timing. Therefore, equalizing the distances between signal input terminals and latch circuits is unnecessary. Hence the distances between the signal input terminals and the latch circuits can be reduced in total. This allows a reduction in charge/discharge current generated at signal paths. Embodiments of the present invention will now be described in detail with reference to the accompanying drawings.

Figure 1:
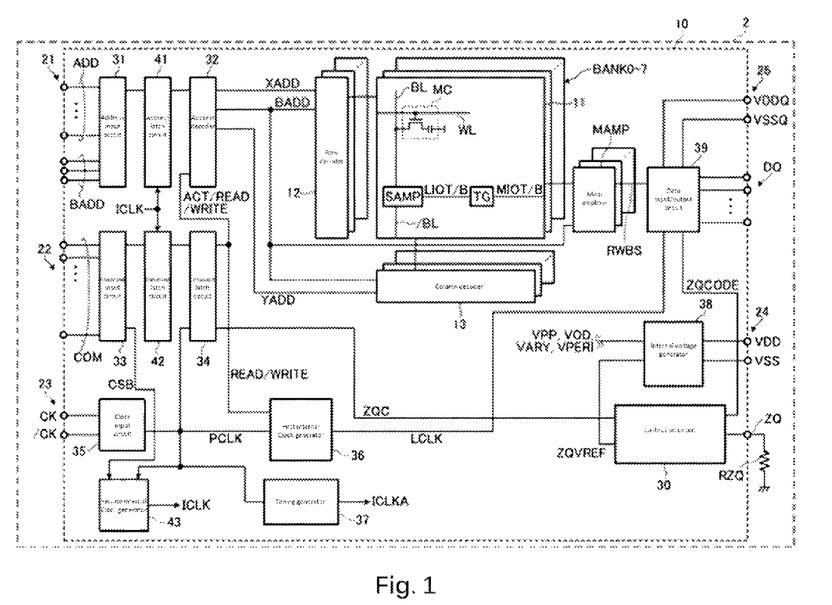
FIG. 1 is a block diagram showing an overall configuration of a semiconductor device according to an embodiment of the present invention.

FIG. 1 is a block diagram showing an overall configuration of a semiconductor device 10 according to an embodiment of the present invention.

The semiconductor device 10 of this embodiment is a DRAM, such as DDR4 (Double Data Rate 4) DRAM and DDR3 DRAM, packaged in a single semiconductor chip, and is mounted on an external substrate 2. The external substrate 2 is a memory module substrate or a mother board, and includes a reference resistance RZQ. The reference resistance RZQ is coupled to a calibration terminal ZQ of the semiconductor device 10, and the impedance of the reference resistance RZQ is used as reference impedance to a calibration circuit 30. The reference resistance RZQ is supplied with a ground voltage VSS in this embodiment. However, the reference resistance RZQ may be supplied also with a source voltage VDD depending on how calibration is carried out.

As shown in FIG. 1, the semiconductor device 10 includes eight memory banks BANK0 to BANK7. Each of the memory banks BANK0 to BANK7 is capable of independently executing a command, and has a memory cell array 11, a row decoder 12, a column decoder 13, and a main amplifier MAMP. The memory cell array 11 has multiple word lines WL, multiple bit lines BL and /BL, and memory cells MC arranged at the intersections of the word lines WL and the bit lines BL and /BL. A word line WL is selected by the row decoder 12, while a bit line BL is selected by the column decoder 13.

Paired bit lines BL and /BL are coupled to a sense amplifier SAMP disposed in the memory cell array 11. The sense amplifier SAMP amplifies a potential difference created between the bit line BL and the bit line /BL and supplies read data obtained by amplifying the potential difference to a complementary local IO line LIOT/LIOB. The read data supplied to the local IO line LIOT/LIOB is transferred to a complementary main IO line MIOT/MIOB via a switch circuit TG. The read data on the main IO line MIOT/MIOB is then sent to the main amplifier MAMP, which converts the read data into a single-ended signal, which is supplied to a data input/output circuit 39 via a read/write bus RWBS.

The semiconductor device 10 also includes an address terminal 21, a command terminal 22, a clock terminal 23, power terminals 24 and 25, a data input/output terminal DQ, and a calibration terminal ZQ, which serve as external terminals. In the following description, external terminals are named based on a naming rule employed for a DDR3 DRAM. In the case of a DDR4 DRAM, etc., an external terminal may be given a different name.

The address terminal 21 is a terminal that receives an address signal ADD and a bank address signal BADD that are incoming external signals. The address signal ADD and bank address signal BADD input to the address terminal 21 are transferred to an address latch circuit 41 via an address input circuit 31. The address signal ADD and bank address signal BADD are latched by the address latch circuit 41, and then are supplied to an address decoder 32. The address decoder 32 includes an address control circuit and a bank address control circuit, which will be described later. The address signal ADD and bank address signal BADD supplied to the address decoder 32 are used as signals for selecting any one of the memory banks BANK0 to BANK7. An address signal ADD representing a row address XADD is supplied to the row decoder 12 of a selected memory bank, and an address signal ADD representing a column address YADD is supplied to the column decoder 13 of a selected memory bank.

The command terminal 22 is a terminal that receives an incoming external command signal COM. The command signal COM input to the command terminal 22 is transferred to a command latch circuit 42 via a command input circuit 33. The command signal COM is latched by the command latch circuit 42, and then is supplied to a command decoder 34. A command signal COM serving as a chip select signal CSB is supplied also to a second internal clock generator 43, which generates an internal clock signal ICLK supplied to the address latch circuit 41 and to the command latch circuit 42.

The command decoder 34 is a circuit that generates various internal commands by decoding the command signal COM. Internal commands include an active signal ACT, a read signal READ, a write signal WRITE, and a calibration signal ZQC.

The active signal ACT is a signal that is activated when the command signal COM indicates a row-accessing command (active command). When the active signal ACT is activated, the row address XADD supplied to the address decoder 32 is supplied to the row decoder 12 of a selected memory bank. As a result, a word line included in the memory cell array 11 of the selected memory bank is selected based on the row address XADD.

The read signal READ and the write signal WRITE are activated when the command signals COM indicate a read command and a write command, respectively. When the read signal READ or write signal WRITE is activated, the column address YADD supplied to the address decoder 32 is supplied to the column decoder 13 of a selected memory bank. As a result, a bit line BL or /BL included in the memory cell array 11 of the selected memory bank is selected based on the column address YADD.

When the active command and read command are input and the row address XADD and column address YADD are also input in synchronization with input of the active command and read command, therefore, read data is read from the memory cell MC specified by the row address XADD and column address YADD. The read data is transferred to the data input/output terminal DQ via the main amplifier MAMP and the data input/output circuit 39, and is output from the data input/output terminal DQ to an external element.

When the active command and write command are input, and the row address XADD and column address YADD are also input in synchronization with input of the active command and write command, and then write data is input to the data input/output terminal DQ, the write data is supplied to the memory cell array 11 via the data input/output circuit 39 and the main amplifier MAMP and is written to the memory cell MC specified by the row address XADD and column address YADD.

The calibration signal ZQC is a signal that is activated when the command signal COM indicates a calibration command. When the calibration signal ZQC is activated, the calibration circuit 30 executes a calibration operation, thereby generates an impedance code ZQCODE.

The external terminals included in the semiconductor device 10 will be described again. The clock terminal 23 receives incoming external clock signals CK and /CK. The external clock signal CK and the external clock signal /CK are complementary to each other, and are supplied to a clock input circuit 35. Receiving the incoming external clock signals CK and /CK, the clock input circuit 35 generates an internal clock signal PCLK, which is supplied to a first internal clock generator 36. The first internal clock generator 36 then generates a phase-controlled internal clock signal LCLK based on the internal clock signal PCLK. The first internal clock generator 36 may be, for example, a DLL circuit. Circuits other than a DLL circuit may also be used as the first internal clock generator 36. The internal clock signal LCLK is supplied to the data input/output circuit 39, which uses the internal clock signal LCLK as a timing signal for determining timing of outputting read data.

The internal clock signal PCLK is supplied also to the second internal clock generator 43, which generates an internal clock signal ICLK based on the internal clock signal PCLK. The internal clock signal ICLK is supplied to the address latch circuit 41 and the command latch circuit 42, which use the internal clock signal ICLK as a control signal indicative of timing of latching the address signal ADD, the bank address signal BADD, and the command signal COM. The details of the address latch circuit 41 and the command latch circuit 42 will be described later.

The internal clock signal PCLK is supplied also to a timing generator 37, which generates various internal clock signals ICLKA based on the internal clock signal PCLK. The internal clock signals ICLKA generated by the timing generator 37 are supplied to such circuit blocks as the row decoder 12 and column decoder 13, where the internal clock signals ICLKA regulate the operation timing of the circuit blocks.

The power terminal 24 is a terminal supplied with the source voltages VDD and VSS. The source voltages VDD and VSS supplied to the power terminal 24 are supplied to an internal voltage generator 38, which generates various internal voltages VPP, VOD, VARY, and VPERI and a reference voltage ZQVREF, based on the source voltages VDD and VSS. The internal voltage VPP is a voltage used mainly by the row decoder 12, the internal voltages VOD and VARY are voltages used by the sense amplifier SAMP in the memory cell array 11, and the internal voltage VPERI is a voltage used by a number of other circuit blocks. The reference voltage ZQVREF is a reference voltage used by the calibration circuit 30.

The power terminal 25 is a terminal supplied with source voltages VDDQ and VSSQ. The source voltages VDDQ and VSSQ supplied to the power terminal 25 are supplied to the data input/output circuit 39. The source voltages VDDQ and VSSQ are identical in potential with the source voltages VDD and VSS supplied to the power terminal 24, respectively, and are used exclusively as source voltages to the data input/output circuit 39.

The calibration terminal ZQ is coupled to the calibration circuit 30. When activated by a calibration signal ZQC, the calibration circuit 30 carries out a calibration operation, referring to the impedance of the reference resistance RZQ and to the reference voltage ZQVREF. An impedance code ZQCODE acquired by the calibration operation is supplied to the data input/output circuit 39, where the impedance of an output unit included in the data input/output circuit 39 is specified according to the impedance code ZQCODE.

Figure 2:
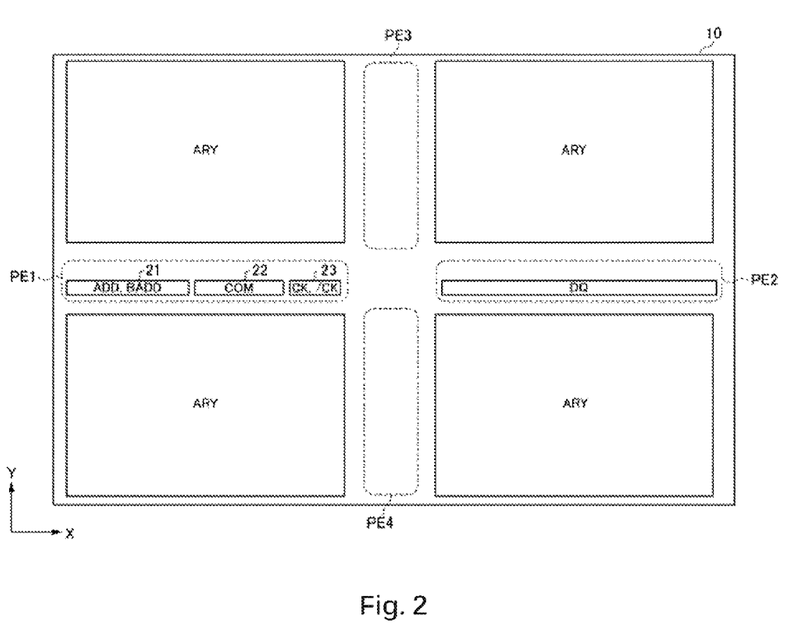
FIG. 2 is a plan view showing a layout of the semiconductor device of FIG. 1.

FIG. 2 is a plan view showing a layout of the semiconductor device 10.

As shown in FIG. 2, the semiconductor device 10 of this embodiment includes four memory cell array regions ARY arranged into a matrix formation. In one memory cell array region ARY, for example, memory cell arrays 11 including two memory banks are formed. Peripheral circuit regions PE1 to PE4 are formed such that the peripheral circuit regions PE3 and PE4 are located respectively between two pairs of memory cell array regions ARY, each pair being adjacent to each other in the X direction, and peripheral circuit regions PE1 and PE2 are located respectively between two pairs of memory cell array regions ARY, each pair being adjacent to each other in the Y direction. The peripheral circuit regions PE1 to PE4 are regions where various circuit blocks other than the memory cell arrays 11 of FIG. 1 are placed.

Components placed in the peripheral circuit region PE1 include the address terminal 21, the command terminal 22, the clock terminal 23, and input terminals 31, 33, and 35 and latch circuits 41 and 42 that correspond to the address terminal 21, command terminal 22, and clock terminal 23. Components placed in the peripheral circuit region PE2 include the data input/output terminal DQ, the calibration terminal ZQ, and the data input/output circuit 39.

As shown in FIG. 2, the above external terminals are arranged into a single row (or two rows) along the X direction. Because of this arrangement, for example, among terminals making up the same address terminal 21, a terminal that receives input of a certain bit of the address signal ADD (e.g., terminal A15) is separated from a terminal that receives input of another bit of the address signal ADD (e.g., terminal A12), across a significant distance in the X direction. Likewise, a terminal that receives input of a certain bit of the address signal ADD (e.g., terminal A15) is separated from a terminal that receives input of a certain bit of the command signal COM (e.g., terminal CASB), across a significant distance in the X direction.

The address signal ADD, the bank address signal BADD, and the command signal COM are all input in synchronization with the external clock signals CK and /CK. Inside the semiconductor device 10, the bits included in the address signal ADD, the bank address signal BADD, and the command signal COM must be latched in synchronization with the bit latching with the corresponding edge of the external clock signals CK and /CK to confirm the bits corresponding to the clock signals CK and /CK. One simple method of realizing this process is to equalize the distances between multiple input terminals included in the address terminal 21 and the latch circuits corresponding to the terminals included in the address terminal 21 and between multiple input terminals included in the command terminal 22 and the latch circuits corresponding to the terminals included in the command terminal 22. This equalization allows signals to reach respective latch circuits at the same time. Hence a latch operation can be carried out properly.

According to this method, however, the distances between input terminals other than the farthest input terminal, whose distance to the corresponding latch circuit is the longest among the entire input terminals, and the corresponding latch circuits must be extended by interconnect detouring so that the extended distances match the distance between the farthest input terminal and the corresponding latch circuit. However, it has been found that such a case leads to the following situations.

Figure 3:
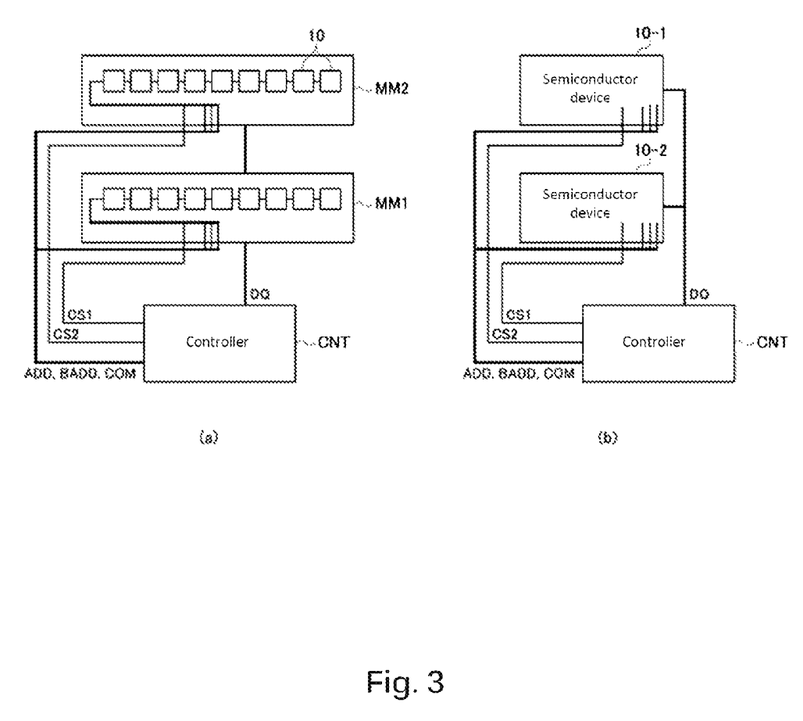
FIG. 3 is a block diagram of information processing systems including the semiconductor device of FIG. 1.

It is widely known that multiple semiconductor devices, such as DRAMs, may be coupled to a single common controller. For example, in an information processing system shown in FIG. 3(a), two memory modules MM1 and MM2 are assigned to one controller CNT, and the address signal ADD, the bank address signal BADD, and the command signal COM are all input to the memory modules MM1 and MM2. The module board of each of the memory modules MM1 and MM2 carries multiple semiconductors 10. In an information processing system shown in FIG. 3(b), two semiconductor devices 10-1 and 10-2 are assigned to one controller CNT, and the address signal ADD, the bank address signal BADD, and the command signal COM are all input to the semiconductor devices 10-1 and 10-2. In both systems, one of the memory modules MM1 and MM2 and one of the semiconductor devices 10-1 and 10-2 can be selected, using chip select signals CS1 and CS2, respectively.

In the system of FIG. 3(a), when one memory module MM1 is selected and is supplied with the address signal ADD, the bank address signal BADD, and the command signal COM, these signals are supplied also to the other memory module MM2 not selected. Similarly, in the system of FIG. 3(b), when one semiconductor device 10-1 is selected and is supplied with the address signal ADD, the bank address signal BADD, and the command signal COM, these signals are supplied also to the other semiconductor device 10-2 not selected. In this manner, various signals are transmitted to the input terminals corresponding thereto, and a state of non-selection of the memory module or semiconductor device is realized through a configuration in which a latch circuit coupled to an input terminal does not latch a signal. In this configuration, however, charge/discharge current is generated also at non-selected elements, i.e., the memory module MM2 and semiconductor device 10-2, because of a change in the address signal ADD, the bank address signal BADD, and the command signal COM. The semiconductor device not selected is in stand-by state in which the semiconductor device does not operate. It is therefore preferable for the system as a whole to keep such charge/discharge current as little as possible.

Because charge/discharge current increases in proportion to the distance between an input terminal and a latch circuit, the method of equalizing the distances between input terminals and latch circuits by interconnect detouring cannot suppress an increase in the stand-by current of a single DRAM and thus cannot reduce current consumption by memory modules and the whole system. Hence such a semiconductor device has been in demand that it can accurately latch the address signal ADD, the bank address signal BADD, and the command signal COM and can reduce charge/discharge current generated at signal paths leading from input terminals to latch circuits. The semiconductor device 10 of this embodiment is provided as such a semiconductor device, and its characteristic configuration will hereinafter be described in detail.

Figure 4:
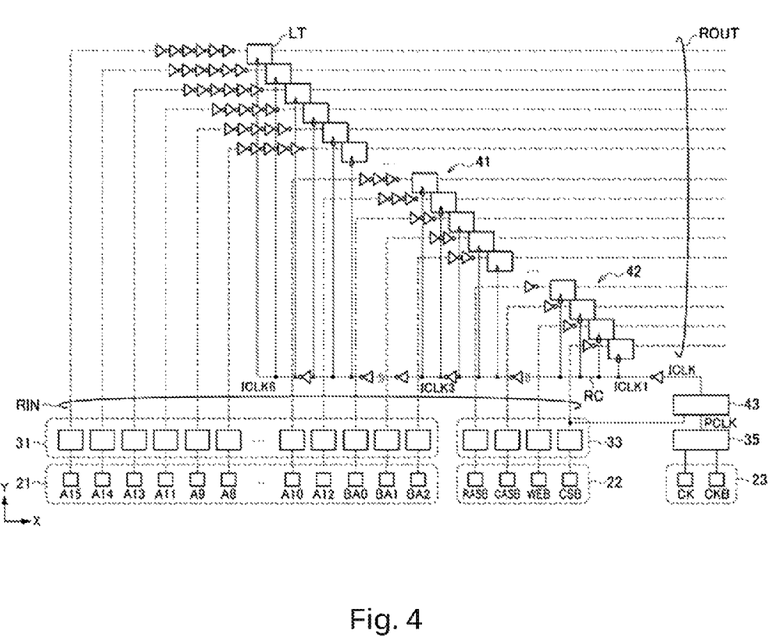
FIG. 4 is a circuit diagram showing a front-stage part of an address latch circuit and a command latch circuit according to an embodiment of the invention.

FIG. 4 is a circuit diagram showing a front-stage part of the address latch circuit 41 and the command latch circuit 42 according to an embodiment of the invention.

As shown in FIG. 4, the address terminal 21 includes 16 input terminals A0 to A15 to which the address signal ADD is input, and 3 input terminals BA0 to BA2 to which the bank address signal BADD is input. The input terminals A0 to A15 and BA0 to BA2 are arranged into a row in the X direction. The command terminal 22 includes 4 input terminals RASB, CASB, WEB, and CSB that are arranged into a row in the X direction. The clock terminal 23 includes 2 input terminals to which the external clock signals CK and /CK are input, respectively. In the following description, a certain input terminal and a signal input thereto may be denoted by the same reference numeral. For example, a signal input to the input terminal A15 may be referred to as signal A15.

The address latch circuit 41 and the command latch circuit 42 have multiple latch circuits LT for latching respective corresponding signals. In this embodiment, the lengths (distances) of signal paths RIN leading from the input terminals to the latch circuits LT corresponding thereto are not equalized. According to the circuit design of this embodiment, an input terminal closer to the clock terminal 23 has a shorter signal path RIN leading to a corresponding latch circuit LT, and an input terminal farther away from the clock terminal 23 has a longer signal path RIN leading to a corresponding latch circuit LT.

For example, because the command terminal 22 is disposed adjacent to the clock terminal 23, the distances from the input terminals RASB, CASB, WEB, and CSB to the corresponding latch circuits LT are shorter than the distances from other input terminals to other latch circuits, and each of the signal paths RIN corresponding to the input terminals RASB, CASB, WEB, and CSB is provided with one inverter serving as a buffer circuit. Among terminals included in the address terminal 21, the input terminal A10 relatively close to the clock terminal 23 has a relatively short distance to the corresponding latch circuit LT, and the signal path RIN corresponding to the input terminal A10 is provided with three inverters serving as buffer circuits. Among terminals included in the address terminal 21, the input terminal A15 farthest away from the clock terminal 23 has the longest distance to the corresponding latch circuit LT, and the signal path RIN corresponding to the input terminal A15 is provided with six inverters serving as buffer circuits.

In this configuration, input signals reach respective corresponding latch circuits LT at different timings. According to this embodiment, however, an internal clock signal is input to each latch circuit LT at a time at which each input signal reaches the latch circuit LT. This allows each latch circuit LT to carry out the latch operation properly. As shown in FIG. 4, the internal clock signal ICLK output from the second internal clock generator 43 is transferred through a clock path RC having several inverters serving as buffer circuits. As a result, multiple internal clock signals ICLK1 to ICLK6 different in phase from each other are generated based on the internal clock signal ICLK. As described above, the second internal clock generator 43 is activated by the chip select signal CSB. The internal clock signal ICLK1 is a signal having passed through one inverter, the internal clock signal ICLK3 is a signal having passed through three inverters, and the internal clock signal ICLK6 is a signal having passed through six inverters.

These internal clock signals ICLK1 to ICLK6 are input as timing signals, respectively, to groups of latch circuits LT corresponding to groups of signal paths RIN, each group of signal paths having inverters identical in number with inverters each of the internal clock signals ICLK1 to ICLK6 have passed through. For example, the internal clock signal ICLK1 having passed through one inverter is supplied to the latch circuits LT corresponding to the command terminal 22 with the signal paths RIN each having one inverter. The internal clock signal ICLK2 having passed through three inverters is supplied to the latch circuit LT corresponding to the input terminal A10 with the signal path RIN having three inverters. The internal clock signal ICLK6 having passed through six inverters is supplied to the latch circuit LT corresponding to the input terminal A15 with the signal path RIN having six inverters.

The number of inverters placed in a signal path RIN is determined in connection with its length. In other words, the address latch circuit 41 and command latch circuit 42 are configured such that for the same latch circuit LT, the length of the signal path RIN leading from the address input circuit 31 or command input circuit 33 to the latch circuit LT becomes almost equal to the length of the clock path RC leading from the clock input circuit 35 to the latch circuit LT.

This puts input signals and internal clock signals in synchronization with each other at all latch circuits LT, thus allowing the latch operation to be carried out properly even if signal paths RIN are not equalized in length. The latch circuits receiving input of the internal clock signals ICLK1, ICLK3, and ICLK5 having passed through the odd inverters carry out the latch operation at falling edges of the internal clock signals, and the latch circuits receiving input of the internal clock signals ICLK2, ICLK4, and ICLK6 having passed through the even inverters carry out the latch operation at rising edges of the internal clock signals.

In the configuration described above, the proper latch operation is realized and at the same time, the total length of the signal paths RIN leading from the address terminal 21 and command terminal 22 to the corresponding latch circuits LT is reduced to be shorter than the total length of the same in the case of equalizing the lengths of the signals paths RIN. Hence charge/discharge current generated at these signals paths RIN is reduced. This applies not only to the case where the semiconductor device 10 is selected by the chip select signal CSB but also to the case where the semiconductor device 10 is not selected. In the case of non-selection of the semiconductor device 10, as indicated in FIG. 4, deactivation of the chip select signal CSB stops the internal clock signal ICLK from clocking, thus preventing the latch circuit LT from carrying out the latch operation. However, at the signal path RIN leading to the latch circuit, a change in the logical level of the address signal ADD, etc., still creates charge/discharge current.

Figure 5:
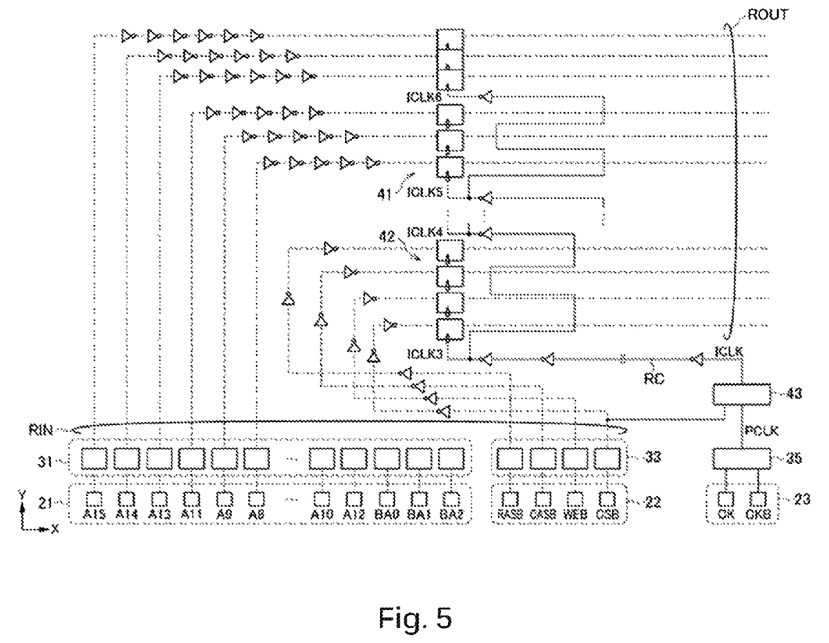
FIG. 5 is a circuit diagram showing a modification of the front-stage part of the address latch circuit and command latch circuit according to an embodiment of the invention.

FIG. 5 is a circuit diagram showing a modification of the front-stage part of the address latch circuit 41 and command latch circuit 42 according to an embodiment of the invention.

The modification of FIG. 5 is different from the circuit diagram of FIG. 4 in that the latch circuits LT are laid out into a single row in the Y direction. According to the modification of FIG. 5, concentrated arrangement of the latch circuits LT makes easier arrangement of other circuits in the peripheral circuit region PE1, thus making circuit designing easier. However, the total length of the signal paths RIN according to such a layout turns out to be longer than the same according to the layout shown in the circuit diagram of FIG. 4. The layout according to the modification of FIG. 5 also requires that the internal clock signals ICLK1 to ICLK6 be generated in correspondence to the lengths of the signal paths RIN. In some cases, therefore, some internal clock signals must be transmitted through detoured interconnects.

As described above, using the address latch circuit 41 and command latch circuit 42 shown in FIGS. 4 and 5 reduces charge/discharge current generated at the signal paths RIN (input signal paths) leading from the input terminals to the latch circuits LT. However, because each latch circuit LT latches an incoming signal at different timing, if signals latched by respective latch circuits LT at different timing are output directly to back-stage circuits, the signals representing bits shifted in timing from each other are input to the back-stage circuits. Such a shift in timing can be offset through signal paths ROUT (output signal paths) leading from the latch circuits LT to the back-stage circuits.

Figure 6:
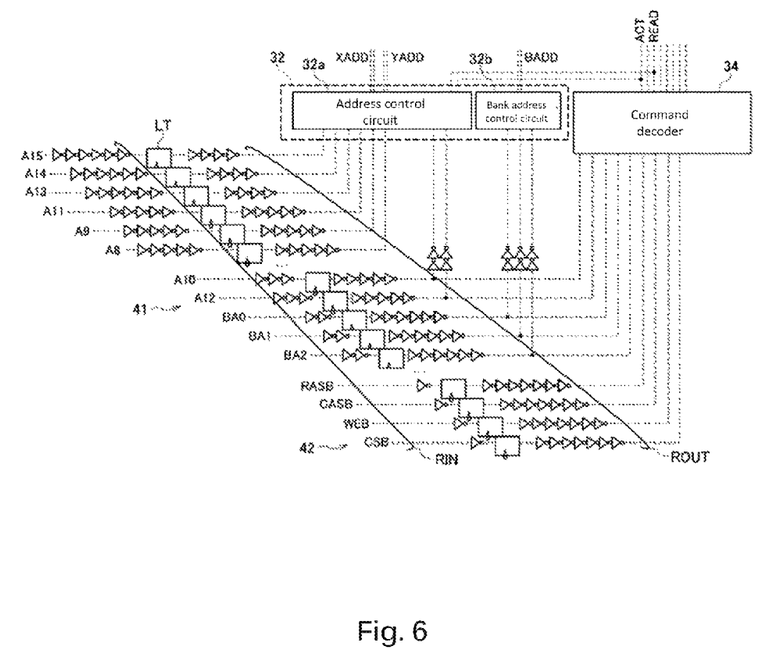
FIG. 6 is a circuit diagram showing a connection relationship between the address latch circuit and command latch circuit and an address decoder and command decoder, according to a first embodiment.

FIG. 6 is a circuit diagram showing a connection relationship between the address latch circuit 41 and command latch circuit 42 and the address decoder 32 and command decoder 34 (which are defined collectively as a control circuit in FIG. 6 as well as in other figures), according to the first embodiment. FIG. 6 depicts a case where the circuit configuration of the front-stage part of the address latch circuit 41 and command latch circuit 42 is the same as the circuit configuration depicted in FIG. 3. Similar to FIG. 6, each of FIGS. 7 to 11 that will be referred to later shows the circuit configuration of the front-stage part of the address latch circuit 41 and command latch circuit 42 that is the same as the circuit configuration depicted in FIG. 3.

As shown in FIG. 6, the output signal paths ROUT located in the back stage to the latch circuits LT are each provided with several inverters serving as buffer circuits. The number of inverters placed in each output signal path ROUT is linked with the number of inverters placed in each input signal path RIN leading to the latch circuit LT corresponding to the output signal path ROUT. Specifically, the total of the number of inverters placed in the input signal path RIN and the number of inverters placed in the output signal path ROUT corresponding to the input signal path RIN is the same for each address bit and for each command bit.

For example, observing a path corresponding to a terminal BA0 reveals that the input signal path RIN leading to the latch circuit LT is provided with 2 inverters and that the output signal path ROUT leading from the latch circuit LT to the address decoder 32 is provided with 8 inverters. The path corresponding to the terminal BA0, therefore, is provided with 10 inverters. Observing a path corresponding to the terminal A15 reveals that the input signal path RIN leading to the latch circuit LT is provided with 6 inverters and that the output signal path ROUT leading from the latch circuit LT to the address decoder 32 is provided with 4 inverters. The path corresponding to the terminal A15, therefore, is also provided with 10 inverters in total. Hence each of bits include in the address signal ADD and bank address signal BADD is input to the address decoder 32 at the same time.

The bank address signal BADD and bits A10 and A12 included in the address signal ADD are used also as part of a command, and are therefore input also to the command decoder 34.

Observing each of paths corresponding respectively to the terminals RASB, CASB, WEB, and CSB reveals that the input signal path RIN leading to the latch circuit LT is provided with 1 inverter and that the output signal path ROUT leading from the latch circuit LT to the command decoder 34 is provided with 7 inverters. Each of the paths corresponding respectively to the terminals RASB, CASB, WEB, and CSB, therefore, is provided with 8 inverters in total. Observing each of paths corresponding respectively to the terminals A10, A12, and BA0 to BA2 reveals that the input signal path RIN leading to the latch circuit LT is provided with 2 inverters and that the output signal path ROUT leading from the latch circuit LT to the command decoder 34 is provided with 6 inverters. Each of the paths corresponding respectively to the terminals A10, A12, and BA0 to BA2, therefore, is provided also with 8 inverters in total. Hence each of the bits included in the command signal COM, the bits A10 and A12 included in the address signal ADD, and the bank address signal BADD are input to the command decoder 34 at the same time.

Receiving these signals, the command decoder 34 generates various internal commands including an active signal ACT and a read signal READ. Some of the generated internal commands, such as the active signal ACT and read signal READ, are supplied to an address control circuit 32a included in the address decoder 32. The address control circuit 32a outputs the incoming address signal ADD as a row address XADD when the active signal ACT is activated, and outputs the address signal ADD as a column address YADD when the read signal READ is activated.

Even when the address signal ADD reaches the address control circuit 32a, therefore, the address control circuit 32a cannot output the row address XADD or column address YADD unless the active signal ACT or read signal READ reaches the address control circuit 32a. In other words, because a signal delay at the command decoder 34 is larger than a signal delay at the address control circuit 32a, the address signal ADD must be delayed in its arrival at the address control circuit 32a. According to this embodiment, however, the number of inverters is so determined that the command signal COM reaches the command decoder 34 earlier than the address signal ADD reaching the address control circuit 32a. This allows the address control circuit 32a to output the row address XADD or column address YADD as soon as the address signal ADD reaches the address control circuit 32a.

Figure 7:
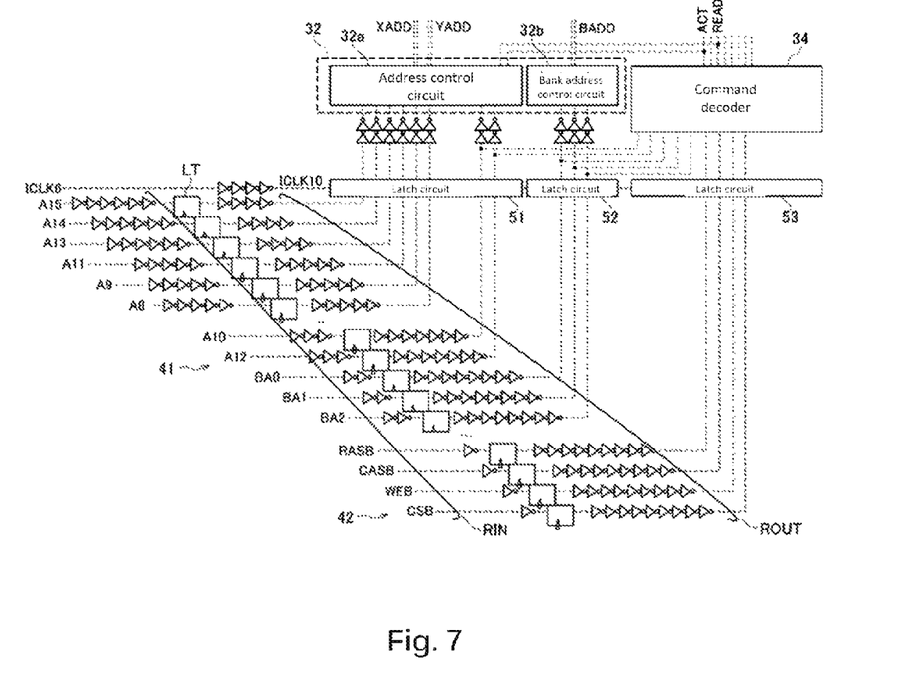
FIG. 7 is a circuit diagram showing a connection relationship between the address latch circuit and command latch circuit and the address decoder and command decoder, according to a second embodiment.

FIG. 7 is a circuit diagram showing a connection relationship between the address latch circuit 41 and command latch circuit 42 and the address decoder 32 and command decoder 34, according to the second embodiment.

As shown in FIG. 7, the circuit diagram of the second embodiment is different from the circuit diagram of the first embodiment of FIG. 6 in that latch circuits 51 to 53 are added to the front stage to the address latch circuit 41 and the command latch circuit 42. The circuit diagram of the second embodiment is basically the same as the circuit diagram of the first embodiment in other respects, and therefore the same constituent elements as described in the first embodiment will be denoted by the same reference numerals and overlapping description will be omitted.

The latch circuits 51 to 53 latch each bit of the address signal ADD, of the bank address signal BADD, and of the command signal COM that has passed through 10 inverters, respectively, in synchronization with the internal clock signal ICLK10. The internal clock signal ICLK10 is a signal created by transferring the internal clock signal 6 through additional 4 inverters. In this configuration, even if respective bits are different in input timing from each other because of the manufacturing variance, voltage variance, temperature variance, etc., of the inverters placed in respective paths, the latch circuits 51 to 53 make input timing uniform. This facilitates circuit design for the address decoder 32 and the command decoder 34.

Among signals latched by the latch circuits 51 to 53, a signal to be input to the address decoder 32 further passes through 2 inverters while a signal to be input to the command decoder 34 is directly input to the command decoder 34 without passing through any additional inverter. As a result, in the same manner as in the first embodiment, the signal to be input to the command decoder 34 reaches the command decoder 34 earlier than the signal to be input to the address decoder 32 reaches the address decoder 32. This allows the address control circuit 32*a* to immediately carry out an operation based on the active signal ACT or read signal READ.

Figure 8:
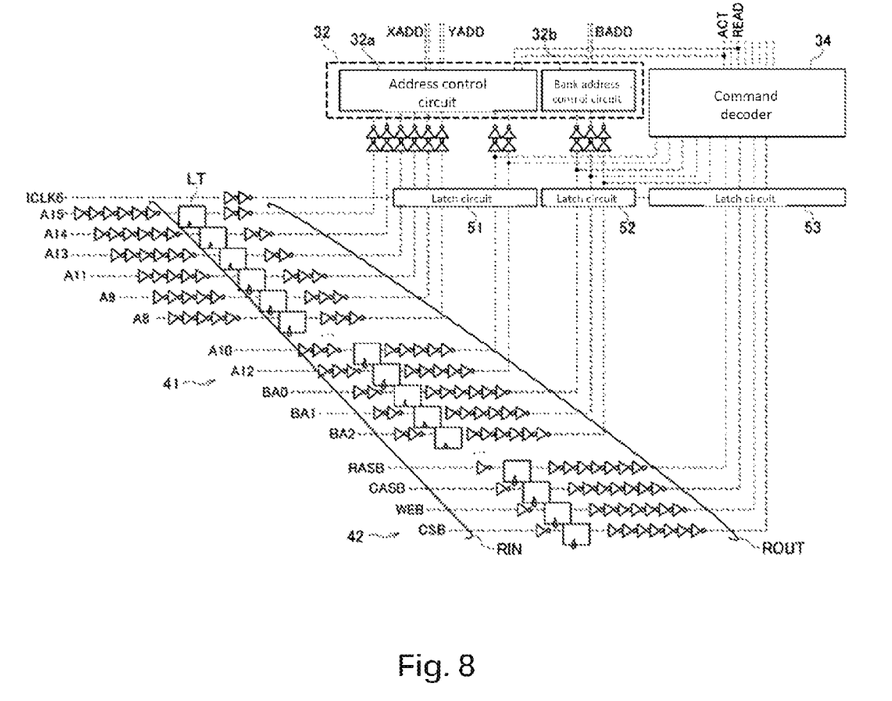
FIG. 8 is a circuit diagram showing a connection relationship between the address latch circuit and command latch circuit and the address decoder and command decoder, according to a third embodiment.

FIG. 8 is a circuit diagram showing a connection relationship between the address latch circuit 41 and command latch circuit 42 and the address decoder 32 and command decoder 34, according to a third embodiment.

The circuit diagram of the third embodiment of FIG. 8 is different from the circuit diagram of the second embodiment of FIG. 7 in that the part of latch circuit 51 that corresponds to the signals A14 and A15, which represent bits included in the address signal ADD, is eliminated. The circuit diagram of the third embodiment is basically the same as the circuit diagram of the second embodiment in other respects, and therefore the same constituent elements as described in the second embodiment will be denoted by the same reference numerals and overlapping description will be omitted.

The configuration of FIG. 8 can be adopted when the latch circuits LT corresponding to the signals A14 and A15 are close to the latch circuit 51. When the latch circuits LT are close to the latch circuit 51, little difference exists between latch timing at the latch circuits LT and latch timing at the latch circuit 51. For this reason, eliminating the part of latch circuit 51 that is located in the back stage to the latch circuits LT hardly affects timing of inputting signals to the address decoder 32. In the example of FIG. 8, only 2 inverters are placed in each of the paths between the latch circuits LT corresponding to the signals A14 and A15 and the latch circuit 51.

In such a case, eliminating the part of latch circuit 51 that corresponds to the signals A14 and A15 leads to a reduction in the number of latch circuits, which contributes to a reduction in the chip area and in current consumption.

Figure 9:
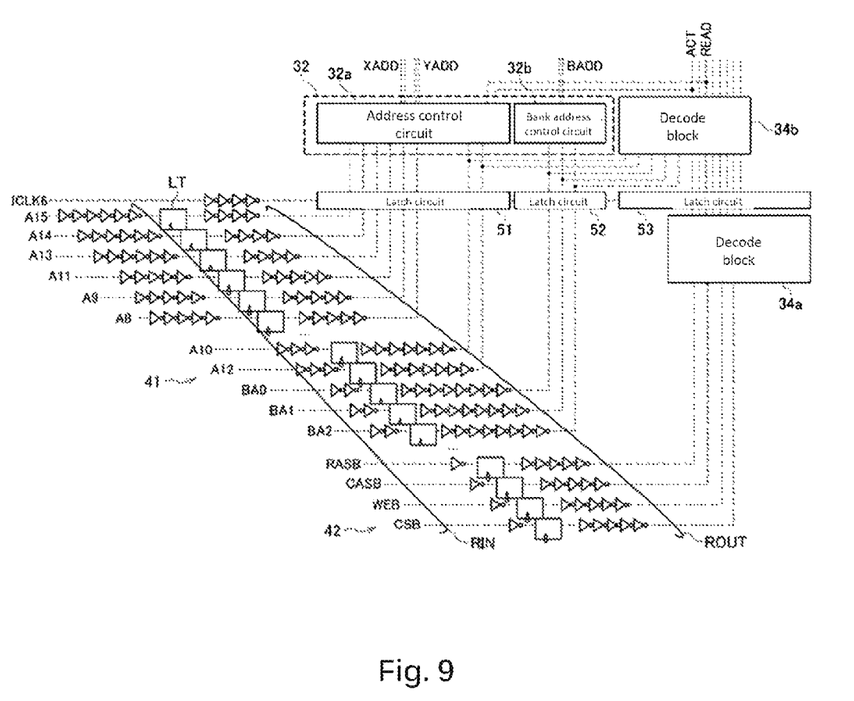
FIG. 9 is a circuit diagram showing a connection relationship between the address latch circuit and command latch circuit and the address decoder and command decoder, according to a fourth embodiment.

FIG. 9 is a circuit diagram showing a connection relationship between the address latch circuit 41 and command latch circuit 42 and the address decoder 32 and command decoder 34, according to a fourth embodiment.

As shown in FIG. 9, the circuit diagram of the fourth embodiment is different from the circuit diagram of the second embodiment of FIG. 7 in that the command decoder 34 is divided into two decode blocks 34*a* and 34*b*, i.e., one part of the command decoder 34 and the other part of the command decoder 34, and that the decode block 34*a*, i.e., one part of the command decoder 34, is disposed in the front stage to the latch circuit 53. The circuit diagram of the fourth embodiment is basically the same as the circuit diagram of the second embodiment in other respects, and therefore the same constituent elements as described in the second embodiment will be denoted by the same reference numerals and overlapping description will be omitted.

The decode block 34*a* is a circuit block that decodes the command signal COM, which is a function that is included in the functions of the command decoder 34. The decode block 34*a*, therefore, is not supplied with the signals A10 and A12 included in the address signal ADD and with the bank address signal BADD, either. The decode block 34*b*, on the other hand, is a circuit block that decodes the bank address signal BADD and the signals A10 and A12 included in the address signal ADD, which is a function that is included in the functions of the command decoder 34. Basic internal commands, such as the active signal ACT and read signal READ, are therefore generated by the decode block 34*a*.

In this embodiment, because the decode block 34*a* is disposed in the front stage to the latch circuit 53, the number of inverters placed in each of the signal paths RIN and ROUT for the command signal COM is reduced in order to adjust timing of signal latching by the latch circuit 53. Specifically, 10 inverters are placed in each of the signal paths RIN and ROUT for the address signal ADD and the bank address signal BADD while 6 inverters are placed in each of the signal paths RIN and ROUT for the command signal COM. This means that the command signal COM reaches the decode block 34*a* earlier because a delay time created by four inverters is eliminated from each of the signal paths for the command signal COM.

If the decode block 34*a* carries out signal decoding within the time equivalent to the delay time of four inverters, all signals are input to the latch circuits 51 to 53 at the same time, respectively. Basic internal commands, such as the active signal ACT and read signal READ, output from the decode block 34*b* have been generated by the decode block 34*a* in the previous stage. The active signal ACT and read signal READ, therefore, bypass the interior of the decode block 34*b* to be supplied immediately to the address control circuit 32*a*. Hence the address signal ADD, the active signal ACT, and the read signal READ are input almost simultaneously to the address control circuit 32*a*.

In this manner, according to this embodiment, because the decode block 34*a*, i.e., one part of the command decoder 34, is disposed in the front stage to the latch circuit 53, it is not necessary to provide a delay (e.g., inverter, etc.) to wait for input of the active signal ACT or read signal READ to the address control circuit 32*a*. This allows the semiconductor device 10 to operate faster.

Figure 10:
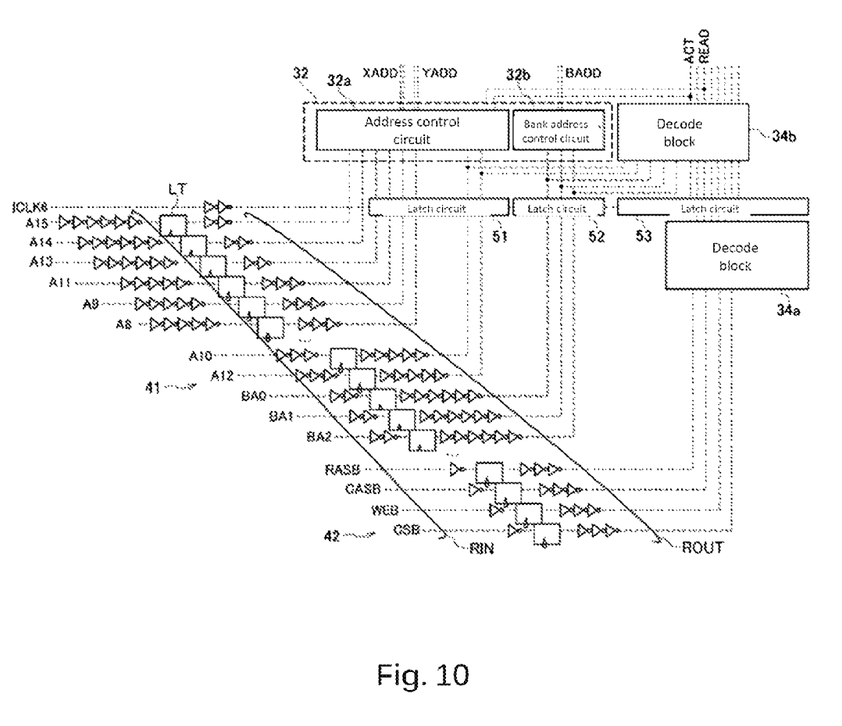
FIG. 10 is a circuit diagram showing a connection relationship between the address latch circuit and command latch circuit and the address decoder and command decoder, according to a fifth embodiment.

FIG. 10 is a circuit diagram showing a connection relationship between the address latch circuit 41 and command latch circuit 42 and the address decoder 32 and command decoder 34, according to a fifth embodiment.

The circuit diagram of the fifth embodiment of FIG. 10 is different from the circuit diagram of the fourth embodiment of FIG. 9 in that the part of latch circuit 51 that corresponds to the signals A14 and A15, which represent bits included in the address signal ADD, is eliminated. The circuit diagram of the fifth embodiment is basically the same as the circuit diagram of the fourth embodiment in other respects, and therefore the same constituent elements as described in the fourth embodiment will be denoted by the same reference numerals and overlapping description will be omitted. An effect achieved by the fifth embodiment is the same as the effect achieved by the third embodiment such that eliminating the part of latch circuit 51 that corresponds to some signals enables a reduction in the chip area and in current consumption.

Figure 11:
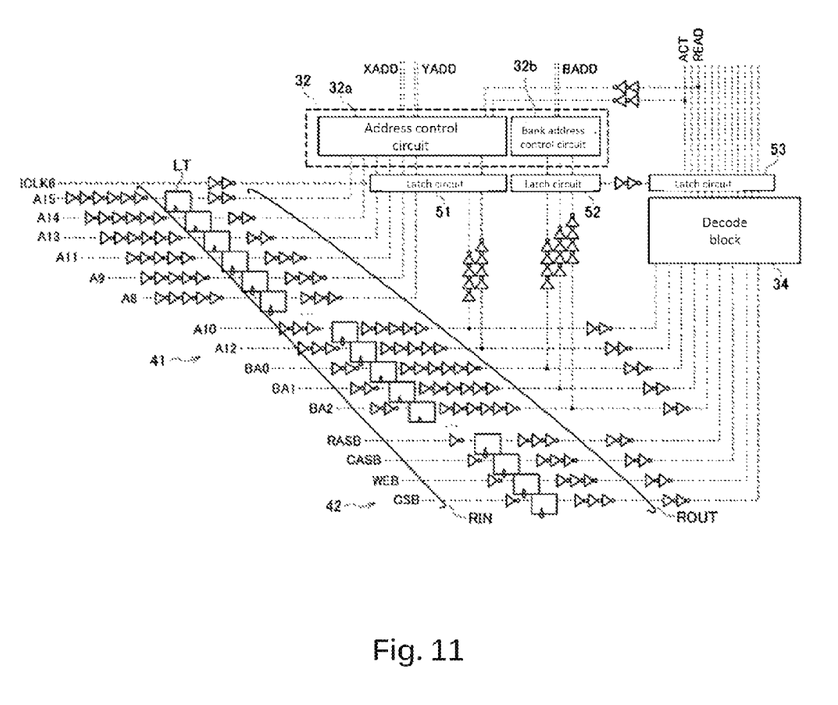
FIG. 11 is a circuit diagram showing a connection relationship between the address latch circuit and command latch circuit and the address decoder and command decoder, according to a sixth embodiment.

FIG. 11 is a circuit diagram showing a connection relationship between the address latch circuit 41 and command latch circuit 42 and the address decoder 32 and command decoder 34, according to a sixth embodiment.

As shown in FIG. 11, the circuit diagram of the sixth embodiment is different from the circuit diagram of the fourth embodiment of FIG. 9 in that the whole command decoder 34 is disposed in the front stage to the latch circuit 53. The circuit diagram of the sixth embodiment is basically the same as the circuit diagram of the fourth embodiment in other respects, and therefore the same constituent elements as described in the fourth embodiment will be denoted by the same reference numerals and overlapping description will be omitted.

In this embodiment, because the whole command decoder 34 is disposed in the front stage to the latch circuit 53, the number of inverters placed in each of the signal paths RIN and ROUT for the signals (COM, A10, A12, BA0 to BA2) input to the command decoder 34 is different from the number of inverters placed in each of the signal paths RIN and ROUT for other signals (A15, etc.) in order to adjust timing of signal latching by the latch circuit 53. Specifically, for the signals input to the command decoder 34, 6 inverters are placed in each of the signal paths RIN and ROUT. For the signals other than those signals, 8 inverters are placed in each of the signal paths RIN and ROUT. This means that the signals reach the command decoder 34 earlier because a delay in the signals passing through two inverters is eliminated from each of the signal paths leading to the command decoder 34.

According to the circuit layout of this embodiment, the command decoder 34 and the latch circuit 53 corresponding thereto are separated from the address decoder 32 and the latch circuits 51 and 52 corresponding thereto. Because of this layout, a timing difference equivalent to a delay by two inverters is created between the latch circuits 51 and 52 that latch the address signal ADD and bank address signal BADD and the latch circuit 53 that latches the command signal COM.

The address signal ADD latched by the latch circuit 51 is input to the address control circuit 32a, and the bank address signal BADD latched by the latch circuit 52 is input to the bank address control circuit 32b. The active signal ACT and the read signal READ are supplied to the address control circuit 32a via two inverters.

In this manner, according to this embodiment, because the command decoder 34 is disposed in the front stage to the latch circuit 53, providing a delay (e.g. inverter, etc.) for delaying input of the active signal ACT or read signal READ to the address control circuit 32a is unnecessary, as is in the fourth embodiment. In addition, the command decoder 34 does not need to be divided. Hence a desired effect can be achieved even if the address decoder 32 is separated from the command decoder 34.

Embodiments of the present invention have been described above. The present invention is not limited to the above embodiments but may be modified into various forms of application. It will be appreciated by those of ordinary skill in the art that modified forms of application are also included in the scope of the invention.

For example, in the above embodiments, the circuit components that latch the address signal ADD and the command signal COM are described. The present invention, however, apply not only to such circuit components but also to a circuit component that latches an arbitrary control signal. For another example, the semiconductor device is not limited to DRAM. SRAM (Static Random Access Memory), Flash memory, ReRAM (Resistive Random Access Memory) and MRAM (Magneto resistive Random Access Memory) etc. are also applicable to this invention as the semiconductor device.

What is claimed is:

1. A device comprising:
a plurality of input terminals;
a control circuit; and
a plurality of signal buses, each of the signal buses being coupled between the control circuit and an associated one of the plurality of input terminals and including one or more first buffers, one or more second buffers and at least one latch circuit coupled between the one or more first buffers and the one or more second buffers, the one or more first buffers of one of the signal buses being different in number from the one or more first buffers of a different one of the signal buses.

2. The device of claim 1, wherein the one or more second buffers of the one of the signal buses is different in number from the one or more second buffers of the different one of the signal buses.

3. The device of claim 2, wherein the one of the signal buses includes a sum total of the one or more first buffers and the one or more second buffers that is equal to the sum total of the one or more first buffers and the one or more second buffers included in the different one of the signal buses.

4. The device of claim 1, further comprising a clock input terminal and a clock bus coupled between the clock input terminal and each of the signal buses at the at least one latch circuit, the clock bus including a plurality of third buffers therein, and the third buffers arranged between the clock input terminal and the one of the signal buses being different in number from the third buffers arranged between the clock input terminal and the different one of the signal buses.

5. The device of claim 1, wherein the input terminals comprise an address input terminal and a command input terminal.

6. The device of claim 5, wherein the control circuit comprises an address control circuit coupled to the address input terminal through the one of the signal buses and a command decode circuit coupled to the command input terminal through the different one of the signal buses.

7. The device of claim 1, wherein the input terminals comprise address input terminals.

8. The device of claim 7, wherein the control circuit comprises an address control circuit coupled to one of the address input terminals through the one of the signal buses and another of the address input terminals through the different one of the signal buses.

9. A device comprising:
first and second input terminals
a control circuit;
first and second latch circuits provided correspondingly to the first and second input terminals;
one or more first buffers coupled between the first input terminal and the first latch circuit;
one or more second buffers coupled between the first latch circuit and the control circuit;
one or more third buffers coupled between the second input terminal and the second latch circuit; and
one or more fourth buffers coupled between the second latch circuit and the control circuit;

the one or more first buffers being larger in number than the one or more third buffers and the one or more second buffers being smaller in number than the one or more fourth buffers.

10. The device of claim 9, further comprising:
a third input terminal;
a third latch circuit;
one or more fifth buffers coupled between the third input terminal and the third latch circuit; and
one or more sixth buffers coupled between the third latch circuit and the control circuit.

11. The device of claim 10, wherein the one or more fifth buffers are equal in number to the one or more first buffers and the one or more sixth buffers are equal in number to the number of the one or more second buffers.

12. The device of claim 10, wherein the one or more fifth buffers are different in number from the one or more first buffers, the one or more fifth buffers being different in number from the one or more third buffers, the one or more sixth buffers being different in number from the one or more second buffers, and the one or more sixth buffers being different in number from the one or more fourth buffers.

13. The device of claim 9, wherein the control circuit comprises an address control circuit coupled to the first input terminal and a command control circuit coupled to the second input terminal.

14. The device of claim 9, wherein the control circuit comprises an address control circuit coupled to each of the first and second input terminals.

15. The device of claim 9, wherein a first group of the one or more first buffers and the one or more second buffers is equal in sum total of number of buffers to a second group of the one or more third buffers and the one or more fourth buffers.

16. The device of claim 9, wherein a first group of the one or more first buffers and the one or more second buffers is equal in sum total of number of buffers to each of a second group of the one or more third buffers and the one or more fourth buffers and a third group of the one or more fifth buffers and the one or more sixth buffers.

17. A system comprising:
a controller including first and second external terminals; and
a memory device including:
third and fourth external terminals coupled respectively to the first and second external terminals;
first and second latch circuits;
one or more first buffers coupled between the third external terminal and the first latch circuit; and
one or more second buffers coupled between the fourth external terminal and the second latch circuit,
the one or more first buffers being different in number from the one or more second buffers.

18. The system of the claim 17, wherein the memory device further includes a control circuit, one or more third buffers coupled between the control circuit and the first latch circuit and one or more fourth buffers coupled between the control circuit and the second latch circuit, the one or more third buffers being different in number from the one or more fourth buffers.

19. The system of the claim 18, wherein a first group of the one or more first buffers and the one or more third buffers is equal in sum total of number of buffers to a second group of the one or more second buffers and the one or more fourth buffers.

20. The system of the claim 17, wherein the controller is configured to provide the first external terminal with an address signal and provide the second external terminal with a command signal.

21. The system of the claim 17, further comprising an additional memory device that includes:
a fifth external terminal coupled to each of the first and third external terminals;
a sixth external terminal coupled to each of the second and fourth external terminals;
third and fourth latch circuits;
one or more fifth buffers coupled between the fifth external terminal and the third latch circuit; and
one or more sixth buffers coupled between the sixth external terminal and the fourth latch circuit,
the one or more fifth buffers being different in number from the one or more sixth buffers.

* * * * *